United States Patent [19]

Forward

[11] 4,376,269
[45] Mar. 8, 1983

[54] ELECTRONIC SECURITY MEMORY INCLUDING ON-OFF CONTROLLED OSCILLATOR

[75] Inventor: Bernard-Edouard Forward, Paris, France

[73] Assignee: U.S. Philips Corporation, New York, N.Y.

[21] Appl. No.: 209,089

[22] Filed: Nov. 21, 1980

[30] Foreign Application Priority Data

Nov. 21, 1979 [FR] France ................. 79 28720

[51] Int. Cl.³ .................... B61L 29/22; H03B 5/12
[52] U.S. Cl. .............................. 331/117 R; 331/173; 331/185; 340/38 R
[58] Field of Search ............... 331/112, 117 R, 185, 331/173; 340/38 R; 246/219

[56] References Cited
U.S. PATENT DOCUMENTS 3,042,870 7/1962 Minner et al. ............ 331/117 R X

FOREIGN PATENT DOCUMENTS 1281318 5/1962 France .

Primary Examiner—Siegfried H. Grimm
Attorney, Agent, or Firm—James J. Cannon, Jr.

[57] ABSTRACT

A security memory having a transistor oscillator with feedback, a power supply input, a control input, and an a.c. output as well as an amplifier. This memory designed in accordance with relay security standards, is of the negative control type, which stores the disappearance of a logic signal which is a function of at least one logic variable. To this end its control input is energized with a voltage whose absolute value is smaller than that of the supply voltage of the oscillator and is connected to the collector of the transistor via a diode, which collector in its turn is connected to a capacitor via a first transformer winding, which capacitor starts and sustains the oscillation.

5 Claims, 1 Drawing Figure

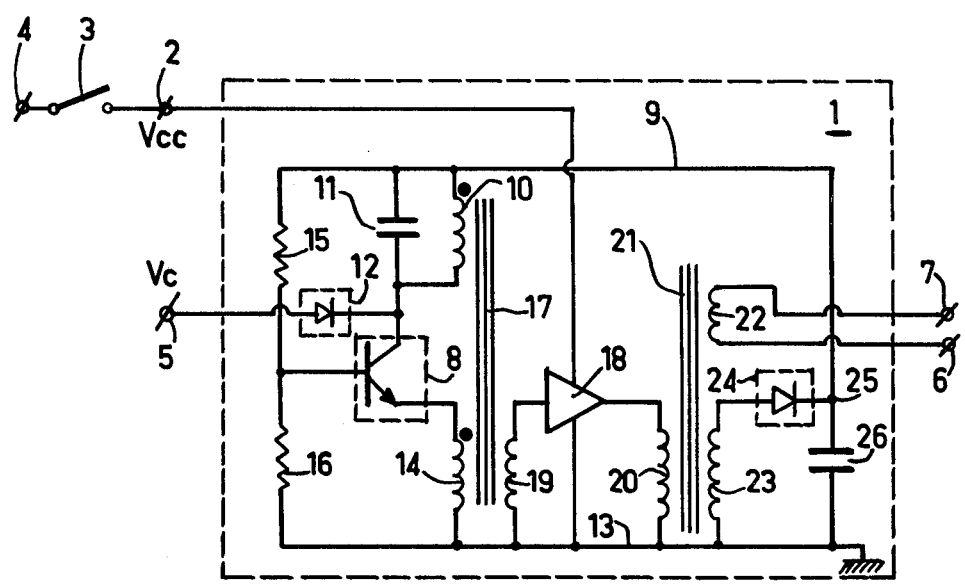

ELECTRONIC SECURITY MEMORY INCLUDING ON-OFF CONTROLLED OSCILLATOR

BACKGROUND OF THE INVENTION

1. Field of the Invention

The invention relates to an electronic security memory having a first input for a d.c. supply voltage, a second input for a control signal, and an output, as well as a transistor oscillator, feedback being provided via a transformer from a primary winding of said transformer to a first secondary winding, the primary winding being connected to the collector and the first secondary winding being connected to another electrode of said transistor, in such a way that a feedback loop is formed in order to produce an oscillation whose frequency is determined by a first capacitor which is connected in parallel with said primary winding, said memory being reset to zero by interruption of the supply voltage.

Such a security memory is mainly employed in railway signalling applications. It can be specifically employed in a processing unit in which it forms part of a logic arrangement which is adapted to control a service relay, which for example controls the closure of a level crossing by means of signals supplied by the detectors of an electronic treadle during the passage of a train.

2. Description of the Prior Art

Electronic security memories as defined in the opening paragraph and intended for such applications are known. Such a memory is described in French patent specification No. 1,281,318. It should be of the security type in terms of railway security, i.e. any defect or failure of the electronic circuit causes the output signal of the oscillator to disappear. Thus, after a breakdown it is not possible to obtain a signal which is more permissive than the normal state. The output of the memory is constituted by an a.c. signal. When the oscillator is in the unblocked state, this a.c. signal is present and by convention it is said that the content of the memory has the logic state "1", said logic state being "0", when the oscillator is blocked, i.e. when its output voltage (a.c. signal) is zero. Such a memory comprises two inputs. The d.c. supply voltage input serves to enable the memory, i.e. in the absence of the d.c. supply voltage the output state is necessarily "0", which state may be "1" or "0" when the d.c. supply voltage is present. The control input receives a control signal which is either a direct voltage or a zero voltage, said control signal representing the information to be stored. Such a memory operates sequentially, and its output state may differ for certain identical input states as a function of previous input states and of their transitions. The memory in accordance with French patent specification No. 1,281,318 is of the positive control type, i.e. it memorises that the direct voltage of the control signal has appeared, supplying a logic output signal equal to "1" during this appearance, the "1" state being subsequently maintained whatever is the waveform of the control signal between its two possible states, as defined in the foregoing. Resetting the memory to zero is subsequently effected by interrupting the supply voltage on the first input. The logic sequence to be realized is indicated in table I on page 3 of the previously mentioned Specification. The prior art memory described in the foregoing is used when the control signal is zero at rest and it becomes non-zero upon the occurrence of an external event. However, in certain cases, it is more interesting that the occurrence of said exterior event is accompanied by the decrease of disappearance of a signal which is normally present. This is for example how a negative directional treadle operates, which comprises two electronic transducers disposed near a railway line. At rest, these transducers are permanently energized with alternating currents, each of a predetermined frequency, by means of an oscillator, which promotes the security in a processor. This produces an alternating signal whose amplitude exceeds a certain threshold, and causes the processor to produce a d.c. signal for each transducer. The output signal of the processor in its turn controls a relay. When a wheel of a railway vehicle moves past each transducer, an inductive variation is produced in said transducer, as a result of which the amplitude of the alternating signal decreases below said threshold, which in the processor results in said d.c. signal passing through zero. It may be useful to memorise the disappearance of said d.c. signal in the processor. If this negative transition is to be stored with the aid of the positively controlled prior-art memory, it should be followed by a logic inverter, which complicates the electronic circuitry and increases the risk of defects, whilst said logic inverter itself should comply with railway security specifications, which increases its complexity in comparison with a normal logic inverter. In practice, it is not the actual state of the transducer whose change is to be stored in the processor, but the appearance or disappearance of a logic function of several logic variables, which may for example include the shielded or non-shielded state of the transducers, when reverting to the example of the negative directional treadle. In order to minimize the number of components it will be more advantageous, depending on the specific case, to use either the logic function itself or its complement, the state of the individual logic variables which are available in the logic array of the processor being given. This means that in certain cases the prior-art security memory is not optimized with respect to the logic function to be stored.

It is an object of the invention to mitigate said drawbacks of the prior art. To this end, the electronic security memory defined in the opening paragraph is characterized in that the memory comprises a power amplifier which is powered via said first input, whose input voltage is supplied by a second secondary winding of said transformer, and which comprises two outputs, one direct current output which is supplied to a second capacitor whose charging voltage, during operation of said oscillator, enables said oscillation to be sustained, and a second, alternating current, output which constitutes said output of the memory, said second input being connected to the collector of said transistor via a diode and supplying a d.c. control voltage having a value which is smaller than the value of the said charging voltage, said signal being capable of blocking said oscillator during its presence and in the absence of an oscillation, its disappearance causing the oscillator to be unblocked starting and maintaining an oscillation in the presence of said supply voltage.

In the case of a logic function of a plurality of variables to be stored, it may be more advantageous to employ a memory of the negative control type, whose control input receives the complement of the logic function considered rather than a memory with positive control in accordance with the prior-art, whose input receives the logic function itself, because it is easier to obtain the complement of said logic function than the function itself.

The invention will now be described in more detail, by way of example, with reference to the accompanying drawing, in which the sole FIGURE is an electronic diagram of a security memory in accordance with the invention, employing an oscillator with a transistor in common-emitter arrangement.

The memory 1 in the FIGURE comprises a first or supply voltage input, which is connected to an input terminal 2. Via a switch 3 the terminal 2 is connected to a terminal 4, which permanently receives a d.c. supply voltage $V_{cc}$, unless said voltage is interrupted by accident. The switch 3 is, for example, controlled by a relay, not shown, which relay may be a service relay which is controlled by the output of a processor, not shown, in which the memory 1 is included. A second or control input is connected to an input terminal 5. An output connected between terminals 6 and 7 supplies a signal which may be either an a.c. signal, which constitutes the logic value "1" or a zero-voltage signal, which constitutes the logic value "0".

The essential part of the memory is constituted by an oscillator comprising a transistor 8, whose collector is connected to a conductor 9 via a parallel connection of an inductance 10 and a capacitor 11. The collector is also connected to the input terminal 5 via a diode 12 included in the reverse direction. The emitter of the transistor 8 is connected to earth conductor 13 via an inductance 14. The base of the transistor 8 is connected to the conductor 9 via a resistor 15 and to the earth conductor 13 via a resistor 16, which two resistors serve for biassing the transistor 8.

The inductance 10 is constituted by the primary winding of a transformer 17, of which a secondary winding constitutes the inductance 14. When the conductor 9 receives a positive d.c. supply voltage originating from capacitor 26, the arrangement comprising the elements 9 to 11 and 13 to 17, (i.e. ignoring the control input connected to terminal 5 and the diode 12) constitutes a transistor oscillator with parallel-series feedback, the transistor being connected in common-emitter arrangement. It is to be noted that, in order to obtain a positive feedback to produce the oscillation and negative feedback to produce no oscillation, the windings 10 and 14 should be wound and connection in the same sense and that the number of turns of the primary winding 10 is of the order of 10 times as great as that of the secondary winding 14. The oscillation frequency is determined by the values $L_{10}$ and $C_{11}$ of the inductance and the capacitance of the elements 10 and 11, respectively. Such an oscillator operates correctly for a frequency range which preferably extends between 1 and 10 kHz.

In addition to the actual oscillator as described in the foregoing, the security memory in accordance with the invention comprises an amplifier 18 which is energized between the input terminal 2 and the earth conductor 13. The amplifier input is connected to the earth conductor 13 via an inductance 19 which is constituted by a second secondary winding of the transformer 17. When the oscillator is operative, the amplifier output supplies a square-wave signal of the oscillator frequency to a primary winding 20 of a second transformer 21, the winding 20 being connected to the ground conductor 13 at its other end. The transformer 21 has two secondary windings, i.e. a winding 22 whose ends are connected to the output terminals 6 and 7 and a winding 23 of which, one end is connected to the ground conductor 13 and the other end to an electrode (for example the anode) of a diode 24. The windings 20 and 23 have the same number of turns, but this is not necessary. The other electrode of the diode 24 is connected to a connection point 25 of the conductor 9, which connection point is connected to the ground conductor 13 via a capacitor 26. The circuit constituted by the diode 24 and the capacitor 26 serves for rectifying the alternating current which is supplied by the winding 23 when the oscillator is operative. Owing to the energy supplied by the amplifier 18, the entire arrangement can sustain the condition of oscillation by compensating for its losses, the capacitor 26 serving as a battery with a charging voltage of $V_{cc}$. In order not to disturb the voltage rectifying circuit and to obtain d.c. isolation, the output of the arrangement is taken from the separate secondary winding 22 of the transformer 21. It is to be noted that when the amplifier 18 is energized, i.e. when the switch 3 is closed, the oscillator remains blocked when the voltage across the capacitor 26 remains near zero and it cannot unblock itself. For the connections of the diodes 12 and 24 indicated in the FIGURE, a positive voltage of a few volts on point 25 suffices to start oscillation, even if said positive voltage is smaller than the supply voltage $V_{cc}$, and a transitional mode is obtained during which the voltage on point 25 increases until it reaches a value which is related to the supply voltage $V_{cc}$ due to the saturation voltage of the amplifier 18, at which value it stabilizes itself during the entire period of operation of the oscillator. After means for stabilization of the charging voltage such as zener diodes may be applied.

The voltage on the input terminal 5 may, for example, have the positive value $V_c$ such that: $V_c 21 V_{cc}$, or the value zero, which values will be said to be those of a control signal corresponding to the logic values "1" and "0", respectively, in order to facilitate the description. Similarly, for example, the positive voltage $V_{cc}$ and the zero voltage on the input terminal 2 will be said to correspond to the logic states "1" and "0", respectively. In this situation it is required, in accordance with the invention, to remember the disappearance of the control signal voltage $V_c$, that is to unblock the oscillator, the latter sustaining itself after this event, regardless of subsequent changes of the control signal on the terminal 5 while this unblocking, followed by a self-sustained operation of the oscillator can only be caused by said change, i.e. it cannot be caused by a different signal sequence on the inputs 2 and 5 or by any defect in the electronic circuit described in the foregoing.

First of all will be described the manner in which the oscillator is unblocked during a transition between the logic states "1" and "0" of the control signal and its oscillation is thereafter sustained.

Since the memory operates sequentially, it is for example assumed that there is an initial rest phase, or first zero-reset phase, in which the inputs 2 and 5 are both in the logic "0" state. This results in a logic "0" at its output, the amplifier 18 not being energized. Subsequently, the memory is loaded by making the input 2 go to the "1" state, the input 5 still being in the "0" state, by closing the switch 3. In this second, loading, phase the memory always produces a "0", because the capacitor 26 is not charged. A third phase is subsequently obtained by making the input 5 go from "0" to "1". During this transition the capacitor 26 is charged to nearly the voltage $V_c$ via the diode 12 (conducting in the forward direction), the winding 10 and the conductor 9 (i.e except for the voltage drop across the diode 12, which is negligible). During this third phase, the oscillator remains blocked (zero voltage on the memory output), for although the capacitor 26 has been charged to a voltage which is suitable to start the oscillation, this is not possible because the winding 10 is short-circuited via capacitor 26 and input 5 (after the transition the potentials of the collector and the conductor 9 are substantially equal). Passing from the third phase to a fourth phase takes place when the control signal voltage $V_c$ is suppressed as a result of which the oscillator is unblocked, its oscillation being started by means of the voltage ($V_c$) of the capacitor 26, while as the oscillation continues the latter voltage increases to the value $V_{cc}$ assuming the windings 20 and 23 of transformer 21 have an equal number of turns. If the control signal voltage $V_c$ on the input terminal 5 is restored, which constitutes a fifth phase, this cannot influence the operation of the oscillator, because the voltage on the collector of the transistor 8 is then higher than the voltage $V_c$ because of the inequality $V_c < V_{cc}$, when the values of $V_c$ and $V_{cc}$ are suitably selected, so that the diode 12 is reverse-biased during said fifth state. The oscillator can then be stopped or the memory be reset to zero only by interrupting the supply voltage $V_{cc}$ (opening the switch 3) regardless of the logic state on the input 5. The logic sequence described in the foregoing which is to be obtained during normal operation of the memory is summarized in the following table I:

TABLE I

| Logic state of the power supply input | Logic state of the control input | Logic state of the output |
| --- | --- | --- |
| "0" | "0" | "0" |
| "1" | "0" | "0" |
| "1" | "1" | "0" |
| "1" | "0" | "1" |
| "1" | "1" | "1" |
| "0" | "1" | "0" |
| "0" | "0" | "0" |

Those skilled in the art can ascertain that there is no other sequence which, as a result of logic input values, can cause the oscillator to start and remain operative, i.e. no condition other than a falling edge on the control input 5 can be stored, allowance being made for the fact that the capacitor 26 has no delaying function, i.e. that its capacitance is small.

Similarly, those skilled in the art can ascertain that the circuit described in the foregoing has been designed, so that a failure of any component in the circuit cannot cause an inadvertent storage operation i.e. that the oscillator cannot be started by any failure whatsoever. In this respect failure is to be understood to mean:
interruption of a resistor (for a given type of resistor selected in respect of railway security),
short circuit or open circuit of a capacitor or a diode,
interruption of a winding or a short-circuit between the terminals of a winding of one transformer,
interruption of an electrode of the transistor, a short-circuit or leakage current between two electrodes of the transistor.

No allowance is to be made for the occurrence of two defects at the same time, assuming that one defect is detected before another will occur.

For example, if the diode 12 becomes open circuit, the capacitor 26 cannot be charged, so that the oscillator cannot become operative. If it is short-circuited, the fifth phase described in the foregoing cannot occur, because the return of the voltage $V_c$ on the input terminal 5 will cause the oscillator to stop by biassing its collector to the voltage $V_c$.

By way of non-limitative example some possible values for certain components of an embodiment of the security memory in accordance with the invention are given below.
Winding 10: 400 turns; inductance of 100 mH
Capacitor 11: capacitance of 10 nF
Operating frequency of the oscillator: 5 kHz
Winding 14: 30 turns.

When reference is made again to the principal application, mentioned in the foregoing, of a negative directional treadle, the following specifications for the security memory in accordance with the invention may be given, without describing the entire device of the principal logic functions to be realized.

The service relay has a break contact, i.e. it is permanently energized in the absence of traffic on the railway. In this situation contact 3 is open, as is shown in FIG. 1.

Cut-out of the relay, which is controlled by the output signal of the processor, causes the switch 3 to close, i.e. the memory to be loaded.

Cut-out of the relay may be caused inadvertently by unexpected failure of a component or a signal when the transducers are subject to an unusual influence). During normal operation (passage of a train) the relay is de-energized by the action of an additional logic network whose state depends on that of the transducers, in conjunction with the "0" state of the output of the security memory.

After it has been de-energized, the relay cannot be reenergized unless the security memory has been operative, i.e. unless the disappearance of a logic function of a plurality of logic variables, which are characteristic of the passage of a train, has been detected and stored.

For certain applications of the security memory in accordance with the invention, it may be necessary to store a disappearance of the control voltage $V_c$ very briefly before the supply voltage $V_{cc}$ appears. For example, it may be desirable that the disappearance of the control voltage $V_c$ indirectly causes the supply voltage $V_{cc}$ to appear by closure of the switch 3 after de-energization of a relay. For instance, a predetermined delay time $\tau$ of the order of some tenths of seconds can elapse between the disappearance of the voltage $V_c$ on the input terminal 5 and the appearance of the voltage $V_{cc}$ on the input terminal 2. In accordance with a second embodiment of the invention, it is also possible to store the disappearance of the voltage $V_c$, under these conditions, by giving the capacitor 26 a timing function. To this end, the circuit arrangement of the memory in this second embodiment still being the same as in FIG. 1, the capacitor 26 has an increased capacitance such that after the time $\tau$ it is still capable of starting the oscillator, i.e. at the instant at which the supply voltage $V_{cc}$ appears, and enables the oscillation to be sustained. The following table II lists the logic sequence which can be obtained, while the sequence given in table I still remains possible.

TABLE II

| Logic state of the power supply input | Logic state of the control input | Logic state of the output |
| --- | --- | --- |
| "0" | "0" | "0" |

TABLE II-continued

| Logic state of the power supply input | Logic state of the control input | Logic state of the output |
|---|---|---|
| "0" | "1" | "0" |
| "0" | "0" | "0" |
| "1" | "0" | "1" |
| "1" | "1" | "1" |
| "0" | "1" | "0" |
| "0" | "0" | "0" |

In table II, the time which elapses between the second and the third transition (passage from "1" to "0" of the control input and passage from "0" to "1" of the power supply input respectively) is equal to $\tau$.

For a correct operation of said second embodiment it should be avoided that the capacitor 26 has too high a capacitance, which would make its charging time too long. The capacitor 26 should become charged during the time interval in which the voltage $V_c$ is present on the input terminal 5.

In a third embodiment, which follows from the circuit arrangement shown in the FIGURE, the security memory in accordance with the invention has a negative power supply: the voltages $V_c$ and $V_{cc}$ have negative values, $V_{cc}$ having a greater absolute value than $V_c$, the transistor 8 is then a PNP transistor, and the connections of the electrodes remain the same as indicated for the NPN transistor in the FIGURE, while the diodes 12 and 24 are connected in the sense opposite to that shown in the FIGURE: the circuit arrangement otherwise remains the same as shown in the sole FIGURE.

In the foregoing description preferred embodiments of the invention are described. However, in order to realize the invention it is alternatively possible to employ other types of oscillators with NPN or PNP transistors, for example a blocking oscillator or a Hartley or a Colpitts oscillator.

What is claimed is:

1. An electronic security memory comprising a first input for a d.c. supply voltage, a second input for a control signal, and an output, as well as a transistor oscillator, feedback being provided via a transformer from a primary winding of said transformer, to a first secondary winding, the primary winding being connected to the collector and the first secondary winding being connected to another electrode of the said transistor, in such a way that a feedback loop is formed in order to produce an oscillation whose frequency is determined by a first capacitor which is connected in parallel with said primary winding, said memory being reset to zero by interruption of the supply voltage, characterized in that the memory comprises a power amplifier which is powered via said first input, whose input voltage is supplied by a second secondary winding of said transformer, and which comprises two outputs, one direct current output which is supplied to a second capacitor whose charging voltage, during operation of said oscillator, enables said oscillation to be sustained, and a second, alternating current output which constitutes said output of the memory, said second input being connected to the collector of said transistor via a diode and supplying a d.c. control voltage having a value which is smaller than the value of the said charging voltage, said signal being capable of blocking said oscillator during its presence, and in the absence of an oscillation, its disappearance causing the oscillator to be unblocked and starting and maintaining an oscillation in the presence of said supply voltage.

2. An electronic security memory as claimed in claim 1, in which said first secondary winding is connected to the emitter of said transistor, said primary winding having the same winding direction as said first secondary winding, the base of said transistor being connected to the junction point of two bias resistors which are connected in series across said second capacitor.

3. An electronic security memory as claimed in claim 1 or 2, characterized in that said transistor is of the NPN-type, that said d.c. supply and control voltages have positive values, and that said diode is connected to the collector of said transistor for conduction in the forward direction.

4. An electronic security memory as claimed in claim 1 or 2, characterized in that said transistor is of the PNP-type, that said d.c. supply and control voltages have negative values and that said diode is connected to the collector of said transistor for conduction in the reverse direction.

5. An electronic security memory as claimed in claims 1 or 2, for use in railway signalling, characterized in that said memory includes means for detecting and storing in the processing unit the disappearance of a specific logic function of a plurality of logic variables of a negative directional treadle.

* * * * *